# (12) United States Patent
An

(10) Patent No.: US 10,249,649 B2
(45) Date of Patent: Apr. 2, 2019

(54) THIN FILM TRANSISTOR ARRAY SUBSTRATE AND DISPLAY PANEL

(71) Applicant: SHENZHEN CHINA STAR OPTOELECTRONICS TECHNOLOGY CO., LTD., Guangdong (CN)

(72) Inventor: Liyang An, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/563,637

(22) PCT Filed: Apr. 18, 2017

(86) PCT No.: PCT/CN2017/080927
§ 371 (c)(1),
(2) Date: Oct. 2, 2017

(87) PCT Pub. No.: WO2018/161408
PCT Pub. Date: Sep. 13, 2018

(65) Prior Publication Data
US 2018/0261627 A1    Sep. 13, 2018

(30) Foreign Application Priority Data

Mar. 10, 2017  (CN) .......................... 2017 1 0141466

(51) Int. Cl.
*H01L 27/00* (2006.01)
*H01L 27/12* (2006.01)
(Continued)

(52) U.S. Cl.
CPC ...... *H01L 27/124* (2013.01); *G02F 1/136286* (2013.01); *G09G 3/36* (2013.01); *H01L 27/3276* (2013.01); *H01L 29/786* (2013.01); *G09G 2300/0426* (2013.01); *G09G 2320/0223* (2013.01)

(58) Field of Classification Search
CPC . H01L 27/3265; H01L 27/124; H01L 29/786; G02F 1/136213; G02F 1/13452; G02F 1/136286; G09G 3/36
See application file for complete search history.

(56) References Cited

U.S. PATENT DOCUMENTS

2014/0098495 A1*  4/2014  Jeon ...................... G02F 1/1345
                                                361/695
2014/0168552 A1*  6/2014  Jo ....................... G02F 1/134363
                                                349/33

(Continued)

*Primary Examiner* — Ahmed N Sefer
(74) *Attorney, Agent, or Firm* — Mark M. Friedman

(57) ABSTRACT

A thin film transistor array substrate and a display panel are provided. A parasitic capacitor is formed from a common line and a data line, and a capacitance value of the parasitic capacitor formed from the data line connected to the connecting line with a larger resistance value and the corresponding common line is less than that of the parasitic capacitor formed from the data line connected to the connecting line with a smaller resistance value and the corresponding common line. Thus the displayed image bright stripes with inconsistent brightness can be avoided from appearing.

20 Claims, 4 Drawing Sheets

(51) Int. Cl.
    *G02F 1/1362*    (2006.01)
    *G09G 3/36*     (2006.01)
    *H01L 29/786*   (2006.01)
    *H01L 27/32*    (2006.01)

(56) References Cited

U.S. PATENT DOCUMENTS

| | | | |
|---|---|---|---|
| 2014/0184964 A1* | 7/2014 | Byeon | G02F 1/134363 |
| | | | 349/33 |
| 2014/0332898 A1* | 11/2014 | Du | H01L 27/124 |
| | | | 257/386 |
| 2016/0252789 A1* | 9/2016 | Zheng | G02F 1/136213 |
| | | | 349/43 |
| 2017/0038654 A1* | 2/2017 | Cheng | G02F 1/133345 |
| 2017/0193914 A1* | 7/2017 | Heo | G09G 3/3611 |
| 2017/0322464 A1* | 11/2017 | Chang | G02F 1/134309 |
| 2017/0330929 A1* | 11/2017 | Park | G09G 3/3225 |

\* cited by examiner

THIN FILM TRANSISTOR ARRAY SUBSTRATE AND DISPLAY PANEL

FIELD OF THE INVENTION

The present disclosure relates to a technical field of displays, and in particular to a thin film transistor array substrate and a display panel.

BACKGROUND OF THE INVENTION

A conventional thin film transistor array substrate has data lines, and at least one part of the data lines are disposed in a fan-out area of the thin film transistor array substrate. The space of the fan-out area is limited, so that the data lines are arrayed orderly in the fan-out area. The length of a part of the data lines are longer than the length of another part of the data lines, and the resistance of the data lines are different since the data lines have different lengths. The shorter data lines have a smaller resistance, and the longer data lines have a larger resistance. Thus the current intensity of the data signal transmitted in the data lines with different lengths is different, and the image displayed from the pixel column corresponding to the data lines with different lengths has bright stripes with inconsistent brightness appear. Thus the image displayed from the display panel of the thin film transistor array substrate could appear the vertical black and white tapes.

As a result, it is necessary to provide new technical solutions to solve the problems existing in the conventional technologies, as described above.

SUMMARY OF THE INVENTION

An object of the present disclosure is to provide a thin film transistor array substrate, which can avoid the displayed image having bright stripes with inconsistent brightness.

To achieve the above objects, the present disclosure provides a thin film transistor array substrate, which comprises a plurality of fan-out areas located in a non-display area of the thin film transistor array substrate, wherein a display area of the thin film transistor array substrate has a plurality of sub display areas corresponding to the fan-out areas respectively, and the sub display areas and the fan-out areas are arranged opposite each other; a plurality of scanning line extended along a first direction; a plurality of data line combinations comprising a plurality of data lines extended along a second direction, wherein the first direction and the second direction are orthogonal to each other; a plurality of common line combinations comprising a plurality of common lines crossing with the data lines, wherein a parasitic capacitor is formed on an overlapping area of the common line and the data line; and a plurality of connecting line combinations, each of which is located in one of the fan-out areas, wherein the connecting line combinations comprise a plurality of connecting lines connecting to the data lines; wherein a capacitance value of the parasitic capacitor formed from the data line connected to the connecting line with a larger resistance value and the corresponding common line is less than that of the parasitic capacitor formed from the data line connected to the connecting line with a smaller resistance value and the corresponding common line; wherein the resistance value of the connecting line is gradually increased from an intermediate area of the fan-out area to two sides of the fan-out area; wherein the connecting line located in the intermediate area of the fan-out area connects to the data line located in an intermediate area of the sub display area, and the connecting line located at the two sides of the fan-out area connects to the data line located at the two sides of the sub display area; wherein a capacitance value of the parasitic capacitors formed from the data line combination and the common line combination are reduced from the intermediate area of the sub display area to the two sides of the sub display area; wherein the common line comprises: a first line being parallel to the data line; and at least one second sub line being parallel to the scanning line; wherein the second sub line and the scanning line are formed from a first metal layer, the first sub line and the data line are formed from a second metal layer, the first sub line and the second sub line are connected by a through hole, and the through hole is disposed through an insulating layer between the scanning line and the data line; and wherein the parasitic capacitor is formed from the data line and the second sub line of the common line.

In one embodiment of the present disclosure, the connecting line combination comprises a first connecting line, a second connecting line, and a third connecting line; the data line combination comprises a first data line, a second data line, and a third data line; and the common line combination comprises a first common line, a second common one, and a third common line; wherein the first connecting line is located the intermediate area of the fan-out area, and the second connecting line and the third connecting line are located at the two sides of the fan-out area respectively; wherein the first data line and the first common line are located in the intermediate area of the sub display area, the second data line and the second common line are located at one side of the sub display area, and the third data line and the third common line are located at the other side of the sub display area; wherein the first data line connects to the first connecting line, the second data line connects to the second connecting one, and the third data line connects to the third connecting line; and wherein a first capacitance value of a first parasitic capacitor formed from the first common line and the first data line matches with a first resistance value of the first connecting line, a second capacitance value of a second parasitic capacitor formed from the second common line and the second data line matches with a second resistance value of the second connecting line, and a third capacitance value of a third parasitic capacitor formed from the third common line and the third data line matches with a third resistance value of the third connecting line.

In one embodiment of the present disclosure, a resistance value of the connecting line located in the intermediate area of the fan-out area is less than that of the connecting line located at the two sides of the fan-out area, a capacitance value of a parasitic capacitor located in the intermediate area of the sub display area is greater than that of a parasitic capacitor located at the two sides of the sub display area.

In one embodiment of the present disclosure, a resistance value of the connecting line is gradually increased from the intermediate area of the fan-out area to the two sides of the fan-out area; and wherein an overlapping area of the common line and the data line connected the connecting line is reduced from the intermediate area of the sub display area to the two sides of the sub display area.

In one embodiment of the present disclosure, a resistance value of the connecting line is gradually increased from the intermediate area of the fan-out area to the two sides of the fan-out area; and wherein a thickness of the insulating layer between the common line and the data line connected the connecting line is gradually increased from the intermediate area of the sub display area to the two sides of the sub display area.

To achieve the above objects, the present disclosure provides a thin film transistor array substrate, which comprises a plurality of fan-out areas located in a non-display area of the thin film transistor array substrate, wherein a display area of the thin film transistor array substrate has a plurality of sub display areas corresponding to the fan-out areas respectively, and the sub display areas and the fan-out areas are arranged opposite each other; a plurality of scanning line extended along a first direction; a plurality of data line combinations comprising a plurality of data lines extended along a second direction, wherein the first direction and the second direction are orthogonal to each other; a plurality of common line combinations comprising a plurality of common lines crossing with the data lines, wherein a parasitic capacitor is formed on an overlapping area of the common line and the data line; and a plurality of connecting line combinations, each of which is located in one of the fan-out areas, wherein the connecting line combinations comprise a plurality of connecting lines connecting to the data ones; wherein a capacitance value of the parasitic capacitor formed from the data line connected to the connecting line with a larger resistance value and the corresponding common line is less than that of the parasitic capacitor formed from the data line connected to the connecting line with a smaller resistance value and the corresponding common line.

In one embodiment of the present disclosure, a resistance value of the connecting line is gradually increased from the intermediate area of the fan-out area to two sides of the fan-out area; and wherein the connecting line located in the intermediate area of the fan-out area connects to the data line located in an intermediate area of the sub display area, and the connecting line located at the two sides of the fan-out area connects to the data line located at the two sides of the sub display area; wherein a capacitance value of the parasitic capacitors formed from the data line combination and the common line combination are reduced from the intermediate area of the sub display area to two sides of the sub display area.

In one embodiment of the present disclosure, the common line comprises: a first sub line being parallel to the data line; and at least one second sub line being parallel to the scanning fine; wherein the second sub line and the scanning line are formed from a first metal layer, the first sub line and the data line are formed from a second metal layer, the first sub line and the second sub line are connected by a through hole, and the through hole is disposed through an insulating layer between the scanning line and the data line; the parasitic capacitor is formed from the data line and the second sub line of the common fine.

In one embodiment of the present disclosure, the connecting line combination comprises a first connecting line, a second connecting line, and a third connecting fine, the data line combination comprises a first data line, a second data line, and a third data line, and the common line combination comprises a first common line, a second common line and a third common line; wherein the first connecting line is located the intermediate area of the fan-out area, and the second connecting line and the third connecting line are located at the two skies of the fan-out area respectively; wherein the first data line and the first common line are located in the intermediate area of the sub display area, the second data line and the second common line are located at one side of the sub display area, and the third data line and the third common line are located at another side of the sub display area; wherein the first data line connects to the first connecting line, the second data line connects to the second connecting line, and the third data fine connects to the third connecting line; and wherein a first capacitance value of a first parasitic capacitor formed from the first common line and the first data line matches with a first resistance value of the first connecting line, a second capacitance value of a second parasitic capacitor formed from the second common line and the second data line matches with a second resistance value of the second connecting line, and a third capacitance value of a third parasitic capacitor formed from the third common line and the third data line matches with a third resistance value of the third connecting line.

In one embodiment of the present disclosure, an overlapping area of the first common line and the first data line has a first area, an overlapping area of the second common line and the second data line has a second area, and an overlapping area of the third common line and the third data line has a third area; wherein the overlapping area of the first common line and the first data line has a first interval between the first common line and the first data line, the overlapping area of the second common line and the second data line has a second interval between the second common line and the second data line, and the overlapping area of the third common line and the third data line has a third interval between the third common line and the third data line; and wherein a first ratio of the first area and the first distance is greater than a second ratio of the second area and the second distance, and the first ratio is greater than a third ratio of the third area and the third distance.

In one embodiment of the present disclosure, a resistance value of the connecting line located in the intermediate area of the fan-out area is less than that of the connecting line located at the two sides of the fan-out area, a capacitance value of a parasitic capacitor located in the intermediate area of the sub display area is greater than that of a parasitic capacitor located at the two sides of the sub display area.

In one embodiment of the present disclosure, a resistance value of the connecting line is gradually increased from the intermediate area of the fan-out area to two sides of the fan-out area; and wherein an overlapping area of the common line and the data line connected the connecting line is reduced from the intermediate area of the sub display area to two sides of the sub display area.

In one embodiment of the present disclosure, a resistance value of the connecting line is gradually increased from the intermediate area of the fan-out area to two sides of the fan-out area; and wherein a thickness of the insulating layer between the common line and the data line connected the connecting line is gradually increased from the intermediate area of the sub display area to two sides of the sub display area.

In one embodiment of the present disclosure, an overlapping area of the data line connected to the connecting line with a larger resistance value and the common line is less than that of the data line connected to the connecting line with a smaller resistance value and the common in the sub display area.

In one embodiment of the present disclosure, a thickness of the insulating layer between the data line connected to the connecting fine with a larger resistance value and the common line is greater than that of the data line connected to the connecting line with a smaller resistance value and the common in the sub display area.

In one embodiment of the present disclosure, in the sub display area, a capacitance value of a parasitic capacitor connected to the connecting line with a larger resistance value is smaller, so as to ensure a current intensity of data signals transmitted in the data lines to be within a predetermined range.

In one embodiment of the present disclosure, the sub display area is strip-shaped, a longitudinal direction of the sub display area and the second direction are parallel, at least two of the sub display areas are arranged by one dimensional array along the first direction, and the fan-out area is located in an end of the sub display area.

In one embodiment of the present disclosure, the scanning line and the second sub line are disposed on the substrate; wherein the thin film transistor array substrate further comprises an insulating layer disposed on the scanning line, the second sub line and the substrate; and wherein the data line and the first sub line are disposed on the insulating layer.

In one embodiment of the present disclosure, a resistance value of the connecting line in the fan-out area is corresponding to a length of the connecting line, a length of the connecting line located in the intermediate of the fan-out area is less than that of the connecting line located at the two sides of the fan-out area.

A display panel, which comprises a thin film transistor array substrate.

The beneficial effect of the present disclosure compared with the prior art is that the bright stripes with inconsistent brightness in the displayed image can be avoided.

To make the above-described present disclosure can be more fully comprehensible, preferred embodiments are provided below, and accompanied with figures which are described in detail as follows.

DETAILED DESCRIPTION OF THE PREFERRED EMBODIMENTS

Regarding the words used in this specification, "an embodiment" mean serving as an example, instance, or illustration. In addition, in this specification and the appended claims, the article "a" in general can be interpreted to mean "one or more" unless specified otherwise or clear from the context to be the singular form.

A display panel of the present disclosure is a thin film transistor liquid crystal display (TFT-LCE).

The display panel comprises a thin film transistor array substrate, a liquid crystal layer, and a color film substrate, wherein the liquid crystal layer is disposed between the thin film transistor array substrate and the color film substrate.

Figure 1:
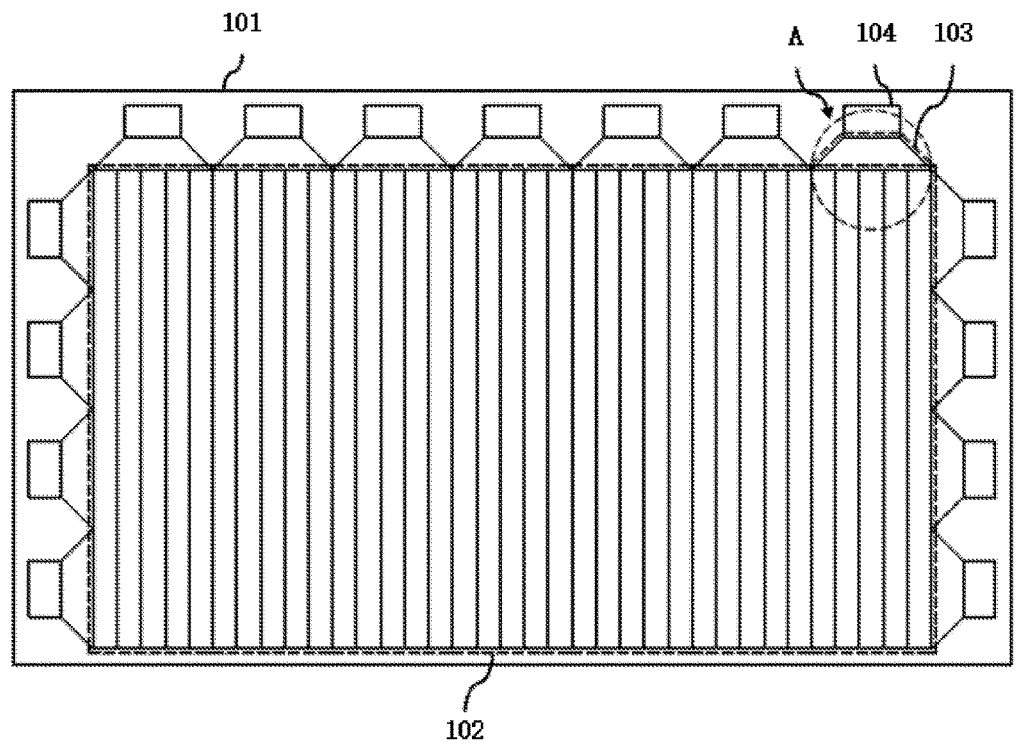
FIG. 1 is a schematic view of a thin film transistor array substrate of the present disclosure.
Figure 2:
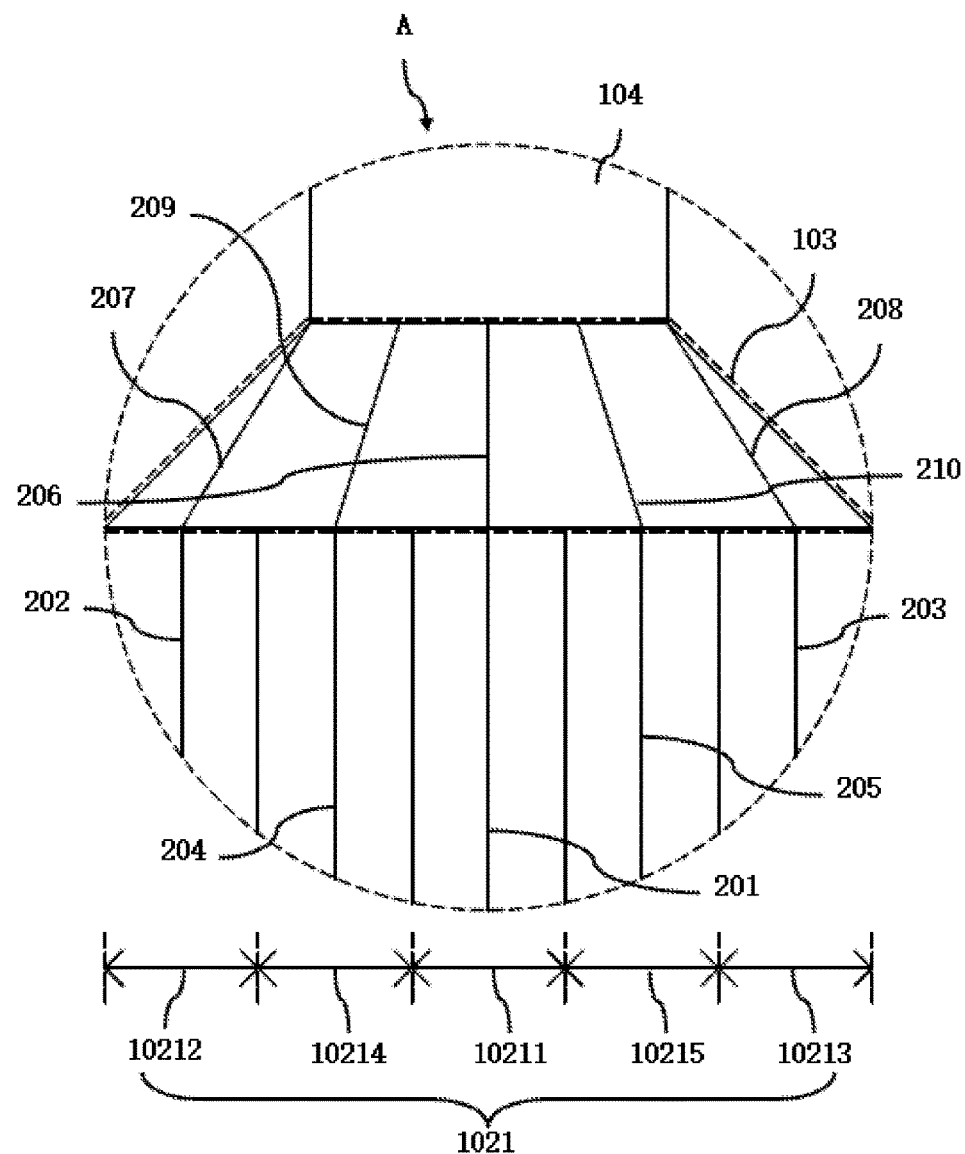
FIG. 2 is a schematic view of area A in FIG. 1.
Figure 3:
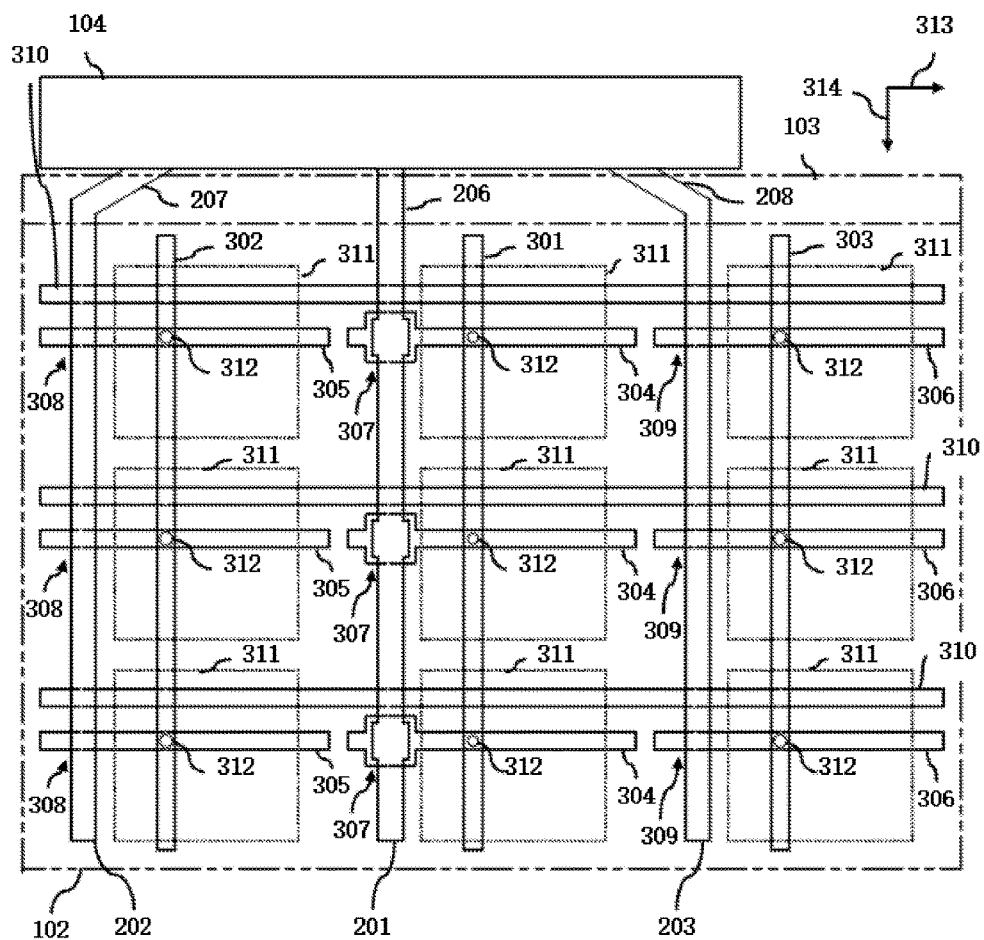
FIG. 3 is a schematic view of a resistance value of the connecting line of the fan-out area and a capacitance value of the parasitic capacitor of sub display area in FIG. 1 or 2.
Figure 4:
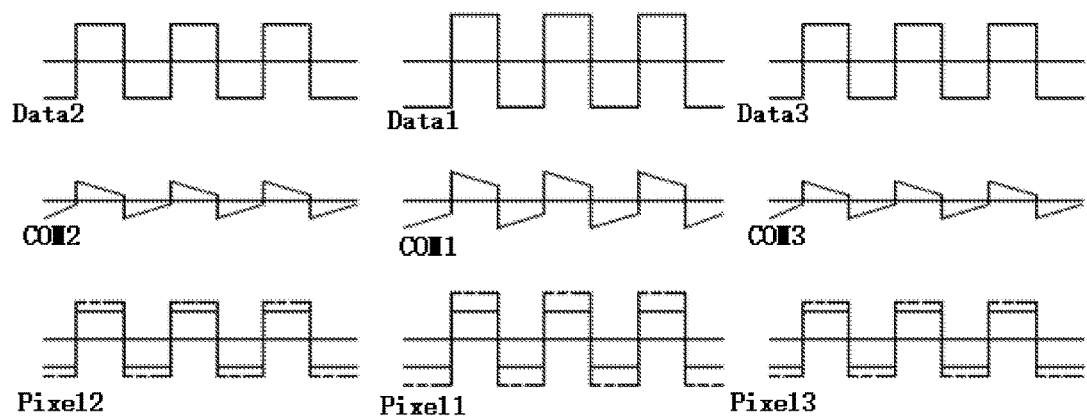
FIG. 4 is a schematic view of signals of a data line, a common line and a pixel unit located in an intermediate area and two sides of the sub display area in FIG. 1 or 2.

Refer to FIGS. 1 to 4, wherein FIG. 1 is a schematic view of a thin film transistor array substrate of the present disclosure, FIG. 2 is a schematic view of area A in FIG. 1, FIG. 3 is a schematic view of a resistance value of the connecting lines 206, 207, 208, 209, 210 of the fan-out area 103 and a capacitance value of the parasitic capacitors 307, 308, 309 of sub display area 1021 in FIG. 1 or 2, and FIG. 4 is a schematic view of signals of a data lines 201, 202, 203, 204, 205, a common line and a pixel unit 311 located in an intermediate area 10211 and two sides 10212, 10213, 10214, 10215 of the sub display area in FIG. 1 or 2.

The thin film transistor array substrate comprises a substrate 101, at least two scanning lines 310, at least one data line combination, at least one common line combination, at least six pixel units 311, and at least one connecting line combination; the connecting line combination corresponds to the data line combination.

The thin film transistor array substrate comprises a display area 102 and at least one fan-out area 103; the display area 102 comprises at least one sub display area 1021, and the fan-out is located at one side of the display area 102; the fan-out area 103 is located in a non-display area of the thin film transistor array substrate, the non-display area is located around the display area 102, and the sub display areas and the fan-out areas are arranged opposite each other. The scanning line 310 and a first direction 313 are parallel to each other, and the scanning line 310 is extended along the first direction 313. The data line combination comprises at least three data lines 201, 202, 203, 204, 205, the data lines 201, 202, 203, 204, 205 and a second direction 314 are parallel to each other, wherein the first direction and the second direction are orthogonal to each other, and the data lines 201, 202, 203, 204, 205 are extended along the second direction 314. The common line combination comprises at least three common lines, and the common lines and the second direction 314 are parallel, and the common lines cross with the data lines.

The connecting line combination comprises at least three connecting lines 206, 207, 208, 209, 201, the connecting lines 206, 207, 208, 209, 201 are connecting to the data lines 201, 202, 203, 204, 205, and the connecting lines are also connecting to a data driving circuit 104. The scanning line 310 is disposed in the display area 102, the data line combination and the common line combination are disposed in the sub display area 1021, the connecting line combination is disposed in the fan-out area 103, a resistance value of the connecting line 206 located in an intermediate area of the fan-out area 103 is less than that of the connecting line 207, 208, 209, 210 located at the two sides of the fan-out area; parasitic capacitors 307, 308, 309 are formed from the common line and the data lines 201, 202, 203, 204, 205, and the parasitic capacitors 307, 308, 309 are formed on an overlapping area of the common line and the data lines 201, 202, 203, 204, 205; a capacitance value of a parasitic capacitor 307 located in the intermediate area 10211 of the sub display area 1021 is less than that of a parasitic capacitor 307 located at the two sides 10212, 10213, 10214, 10215 of the sub display area 1021.

Specifically, this material of all connecting lines 206, 207, 208, 209, 210 in the fan-out area 103 are the same, an area of the cross section of all connecting lines 206, 207, 208, 209, 210 is the same; the resistance value of the connecting lines 206, 207, 208, 209, 210 located in fan-out area 103 corresponds to the length of the connecting line 206, 207, 208, 209, 210; the length of the connecting line 206 located in the intermediate area of the fan-out area 103 is less than the length of the connecting lines 207, 208, 209, 210 located at the two sides of the fan-out area 103.

The pixel units 311 comprise thin film transistor switches and pixel electrodes, and the thin film transistor switches connect to the scanning line 310, the data lines 201, 202, 203, 204, 205, and the pixel electrodes.

The sub display area 1021 is strip-shaped, a longitudinal direction of the sub display area 1021 and a second direction 314 are parallel, at least two of the sub display areas 1021 are arranged by one dimensional array along the first direction 313, and the fan-out area 103 is located in an end of the sub display area 1021.

At least two scanning lines 310 are arranged by one dimensional array along the second direction 314; at least three data lines 201, 202, 203, 204, 205 are arranged by one dimensional array along the first direction 313; at least three common lines are arranged by one dimensional array along the first direction 313.

At least six pixel units 311 are arranged by two dimensional array along the first direction 313.

In the thin film transistor array substrate of the present disclosure, the resistance value of the connecting lines 206, 207, 208, 209, 210 of the connecting line combination is gradually increased from the intermediate area of the fan-out area 103 to two sides of the fan-out area 103; the capacitance value of the parasitic capacitor formed from the data line connected to the connecting line with a larger resistance value and the corresponding common line is less than that of the parasitic capacitor formed from the data line connected to the connecting line with a smaller resistance value and the corresponding common line.

The connecting line 206 located in the intermediate area of the fan-out area 103 connects to the data line 201 located in the intermediate area 10211 of the sub display area 1021; and the connecting lines 207, 208, 209, 210 located at the two sides of the fan-out area 103 connect to the data lines 202, 203, 204, 205 located at the two sides 10212, 10213, 10214, 10215 of the sub display area 1021.

At least three capacitance values of the parasitic capacitors 307, 308, 309 formed from the data line combination and the common line combination are reduced from the intermediate area 102111 of the sub display area 1021 to two sides 10212, 10213, 10214, 10215 of the sub display area 1021.

In the parasitic capacitors 307, 308, 309 formed from the data line combination and the common line combination, an overlapping area of the common line and the data lines 201, 202, 203, 204, 205 is reduced from the intermediate area 10211 of the sub display area 1021 to the two sides 10212, 10213, 10214, 10215 of the sub display area 1021.

In the thin film transistor array substrate of the present disclosure, the common line comprises a first sub lines 301, 302, 303, and at least one second sub lines 304, 305, 306, wherein second sub lines 304, 305, 306 are parallel to the scanning line 310, the first sub lines 301, 302, 303 are parallel to the data lines 201, 202, 203.

The second sub lines 304, 305, 306 and the scanning line 310 are formed from a first metal layer, the first sub lines 301, 302, 303 and the data lines 201, 202, 203, 204, 205 are formed from a second metal layer, the first sub lines 301, 302, 303 and the second sub lines 201, 202, 203, 204, 205 are connected by a through hole 312, and the through hole 312 is disposed through an insulating layer between the scanning line 310 and the data lines 201, 202, 203, 204, 205. Specifically, one part of the first sub lines 301, 302, 303 and/or one part of the second sub ones 304, 305, 306 are disposed in the through hole 312.

The parasitic capacitors 307, 308, 309 are formed from the data lines 201, 202, 203, 204, 205 and the second sub ones 305, 305, 306 of the common line.

The scanning line 310 and the second sub lines 304, 305, 306 are disposed on the substrate 101. The thin film transistor array substrate further comprises an insulating layer, the insulating layer is disposed on the scanning line 310, the second sub lines 304, 305, 306, and the substrate 101. The data lines 201, 202, 203, 204, 205 and the first sub lines 301, 302, 303 are disposed on the insulating layer.

In the thin film transistor array substrate of the present disclosure, the at least three connecting lines 206, 207, 208, 209, 210 comprise a first connecting line 206, a second line 207, and a third line 208; the at least three data lines 202, 203, 204, 205 comprise a first data line 201, a second data line 202, and a third data line 203; the at least three common lines comprise a first common line, a second common line, and a third common line.

The first connecting line 206 is located in the intermediate area of the fan-out area 103, the second connecting line 207 and the third connecting line 208 are located at the two sides of the fan-out area 103.

The first data line 201 and the common line are located in the intermediate area 10211 of the sub display 1021; the second data line 202 and the second common line are located at one side of the sub display 1021; the third data line 203 and the third common line are located at the other side of the sub display area 1021.

The first data line 201 connects to the first connecting line 206; the second data line 202 connects to the second connecting line 207; the third data line 203 connects to the third connecting line 208.

A first capacitance value of a first parasitic capacitor 307 formed from the first common line and the first data line 201 matches with a first resistance value of the first connecting line 206; a second capacitance value of a second parasitic capacitor 308 formed from the second common line and the second data line 202 matches with a second resistance value of the second connecting line 207; and a third capacitance value of a third parasitic capacitor 309 formed from the third common line and the third data line 203 matches with a third resistance value of the third connecting line 208.

A resistance value of the connecting line located hi the intermediate area of the fan-out area 103 is less than that of the connecting line located at the two skies of the fan-out area; a capacitance value of a parasitic capacitor located in the intermediate area of the sub display area 1021 is greater than that of a parasitic capacitor located at the two skies of the sub display area 1021.

A resistance value of the connecting line is gradually increased from the intermediate area of the fan-out area 103 to the two skies of the fan-out area 103; an overlapping area of the common line and the data line connected to the connecting line is reduced from the intermediate area of the sub display area 1021 to the two sides of the sub display area 1021.

A resistance value of the connecting line is gradually increased from the intermediate area of the fan-out area 103 to the two sides of the fan-out area 103; and a thickness of the insulating layer between the common line and the data line connected the connecting line is gradually increased from the intermediate area of the sub display area 1021 to the two sides of the sub display area 1021.

In the sub display area 1021, an overlapping area of the data line connected to the connecting line with a larger resistance value and the common line is less than that of the data line connected to the connecting line with a smaller resistance value and the common line in the sub display area.

In the sub display area 1021, a thickness of the insulating layer between the data line connected to the connecting line with a larger resistance value and the common line is greater than that of the data line connected to the connecting line with a smaller resistance value and the common in the sub display area.

In the sub display area 1021, a capacitance value of a parasitic capacitor connected to the connecting line with a larger resistance value is smaller, so as to ensure a current intensity of data signals transmitted in the data lines to be within a predetermined range.

An overlapping area of the first common line and the first data line 201 has a first area, an overlapping area of the second common line and the second data line 202 has a second area, and an overlapping area of the third common line and the third data line 203 has a third area.

The overlapping area of the first common line and the first data line 201 has a first interval between the first common line and the first data line 201, the overlapping area of the second common line and the second data line 202 has a second interval between the second common line and the second data line 202, and the overlapping area of the third common line and the third data line 203 has a third interval between the third common line and the third data line 203.

A first ratio of the first area and the first distance is greater than a second ratio of the second area and the second distance, and the first ratio is greater than a third ratio of the third area and the third distance.

Preferably, the first area, the second area, and the third area are not equal in the embodiment; for simplifying the production process, the first distance, the second distance and the third distance are equal; the first area, the second area and the third area are obtained by modifying the pattern of the corresponding position of a mask in the production process of the second sub line and the data line, and implemented by adjusting the overlapping area of the second sub line and the data line. In the embodiment, one sub display area 1021 and one fan-out area 103 are arranged opposite each other; in the production process of the second sub line and the data line, a width of the connecting line located in the fan-out area 103 and the data line connected to the corresponding connecting line is gradually reduced, and a width of the common line overlapped with the data line is gradually reduced, so that the parasitic capacitor 308 is gradually increased from the two sides of the sub display area to the intermediate area of the sub display area.

In another embodiment, the thickness of the insulating layer is disposed unevenly by using the half gray scale mask, and the first interval, the second interval, and the third interval are unequal that can be implemented. For adjusting the capacitance value of the parasitic capacitor between the two sides of the sub display and the intermediate area of the sub display, and keeping the first area, the second area, and the third area (the overlapping area of the data lines and the common lines are the same), the aching process of the insulating layer is increased, so that the thickness of the insulating layer between the data line and the common line is gradually reduced from the two sides of the sub display area to the intermediate area of the sub display area.

In another embodiment, the overlapping area of the data line and the common line and the insulating layer is changed to adjusting the capacitance value of the parasitic capacitor, which is not discussed here.

In the thin film transistor array substrate of the present disclosure, a current intensity of the first data signal Data 1 transmitted in the first data line 201 is adjusted by using the first parasitic capacitor 307, so that the current intensity of the first data signal Data 1 is within a predetermined range.

A current intensity of the second data signal Data 2 transmitted in the second data line 202 is adjusted by using the second parasitic capacitor 308, so that the current intensity of the second data signal Data 2 is within a predetermined range.

A current intensity of the third data signal Data 3 transmitted in the third data line 203 is adjusted by using the third parasitic capacitor 309, so that the current intensity of the third data signal Data 3 is within a predetermined range.

The first parasitic capacitor 307, the second parasitic capacitor 308, and the third parasitic capacitor 308 are used, so that the difference of the current intensity inputted to the two pixel units 311 of the two pixel unit column of the sub display area 1021 is less than the predetermined range.

Therefore, for the difference of the resistance of the connecting line in the fan-out area, the overlapping area or interval of the common line and the data line is adjusted, and the capacitance value of the different parasitic capacitor is selected to ensure that the capacitance value of the parasitic capacitor connected to the connecting line with a larger resistance value is smaller, and the capacitance value of the parasitic capacitor connected to the connecting line with a smaller resistance value is larger. So that the display brightness of each column of the pixel unit 311 can be adjusted accurately, and the object of improving the vertical black and white tapes.

In the present disclosure, the first parasitic capacitor 307 is formed from the first common line COM1 and the first data line 201, the second parasitic capacitor 308 is formed from the second common line COM2 and the second data line 202, and the third parasitic capacitor 309 is formed from the third common COM3 and the third data line 203; the first parasitic capacitor 307, the second parasitic capacitor 308 and the third parasitic capacitor 309 are used to adjust the current intensity of the first data signal Data 1 transmitted in the first data line 201, the second data signal Data 2 transmitted in the second data line 202, and the third data signal Data 3 transmitted in the third data line 203, so that the current intensity Pixel 1, Pixel 2, Pixel 3 inputted to the two pixel units 311 of the two pixel unit column of the sub display area 1021 is in the predetermined range, and the difference of the current intensity Pixel 1, Pixel 2, Pixel 3 inputted to the two pixel units 311 of the two pixel unit column of the sub display area 1021 is less than the predetermined range.

Therefore, the capacitance value of the parasitic capacitor between the common line and the data line in different sub display area is changed to solve the problem of the bright stripes having inconsistent brightness because of the different resistance of the connecting line of the fan-out area.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. A thin film transistor array substrate, comprising:
a plurality of fan-out areas located in a non-display area of the thin film transistor array substrate, wherein a display area of the thin film transistor array substrate has a plurality of sub display areas corresponding to the fan-out areas respectively, and the sub display areas and the fan-out areas are arranged opposite each other;
a plurality of scanning lines extended along a first direction;
a plurality of data line combinations comprising a plurality of data lines extended along a second direction, wherein the first direction and the second direction are orthogonal to each other;
a plurality of common line combinations comprising a plurality of common lines crossing with the data lines, wherein a parasitic capacitor is formed on an overlapping area of the common line and the data line; and
a plurality of connecting line combinations, each of which is located in one of the fan-out areas, wherein the connecting line combinations comprise a plurality of connecting lines connecting to the data lines;
wherein a capacitance value of the parasitic capacitor formed from the data line connected to the connecting line with a larger resistance value and the corresponding common line is less than that of the parasitic capacitor formed from the data line connected to the connecting line with a smaller resistance value and the corresponding common line;
wherein the resistance value of the connecting line is gradually increased from an intermediate area of the fan-out area to two sides of the fan-out area;
wherein the connecting line located in the intermediate area of the fan-out area connects to the data line located in an intermediate area of the sub display area, and the connecting line located at the two sides of the fan-out area connects to the data line located at the two sides of the sub display area;
wherein a capacitance value of the parasitic capacitors formed from the data line combination and the common line combination are reduced from the intermediate area of the sub display area to the two sides of the sub display area;
wherein the common line comprises:
a first sub line being parallel to the data line; and
at least one second sub line being parallel to the scanning line;
wherein the second sub line and the scanning line are formed from a first metal layer, the first sub line and the data line are formed from a second metal layer, the first sub line and the second sub line are connected by a through hole, and the through hole is disposed through an insulating layer between the scanning line and the data line; and
wherein the parasitic capacitor is formed from the data line and the second sub line of the common line.

2. The thin film transistor array substrate according to claim 1, wherein the connecting line combination comprises a first connecting line, a second connecting line, and a third connecting line; the data line combination comprises a first data line, a second data line, and a third data line; and the common line combination comprises a first common line, a second common line, and a third common line;
wherein the first connecting line is located the intermediate area of the fan-out area, and the second connecting line and the third connecting line are located at the two sides of the fan-out area respectively;
wherein the first data line and the first common line are located in the intermediate area of the sub display area, the second data line and the second common line are located at one side of the sub display area, and the third data line and the third common line are located at the other side of the sub display area;
wherein the first data line connects to the first connecting line, the second data line connects to the second connecting line, and the third data line connects to the third connecting line; and
wherein a first capacitance value of a first parasitic capacitor formed from the first common line and the first data line matches with a first resistance value of the first connecting line, a second capacitance value of a second parasitic capacitor formed from the second common line and the second data line matches with a second resistance value of the second connecting one, and a third capacitance value of a third parasitic capacitor formed from the third common line and the third data line matches with a third resistance value of the third connecting line.

3. The thin film transistor array substrate according to claim 1, wherein a resistance value of the connecting line located in the intermediate area of the fan-out area is less than that of the connecting line located at the two sides of the fan-out area, a capacitance value of a parasitic capacitor located in the intermediate area of the sub display area is greater than that of a parasitic capacitor located at the two sides of the sub display area.

4. The thin film transistor array substrate according to claim 1, wherein a resistance value of the connecting line is gradually increased from the intermediate area of the fan-out area to the two sides of the fan-out area; and
wherein an overlapping area of the common line and the data line connected the connecting line is reduced from the intermediate area of the sub display area to the two sides of the sub display area.

5. The thin film transistor array substrate according to claim 1, wherein a resistance value of the connecting line is gradually increased from the intermediate area of the fan-out area to the two sides of the fan-out area; and
wherein a thickness of the insulating layer between the common line and the data line connected the connecting line is gradually increased from the intermediate area of the sub display area to the two sides of the sub display area.

6. A thin film transistor array substrate, comprising:
a plurality of fan-out areas located in a non-display area of the thin film transistor array substrate, wherein a display area of the thin film transistor array substrate has a plurality of sub display areas corresponding to the fan-out areas respectively, and the sub display areas and the fan-out areas are arranged opposite each other;
a plurality of scanning line extended along a first direction;
a plurality of data line combinations comprising a plurality of data lines extended along a second direction, wherein the first direction and the second direction are orthogonal to each other;
a plurality of common line combinations comprising a plurality of common lines crossing with the data lines, wherein a parasitic capacitor is formed on an overlapping area of the common line and the data line; and
a plurality of connecting line combinations, each of which is located in one of the fan-out areas, wherein the connecting line combinations comprise a plurality of connecting lines connecting to the data lines;
wherein a capacitance value of the parasitic capacitor formed from the data line connected to the connecting line with a larger resistance value and the corresponding common line is less than that of the parasitic capacitor formed from the data line connected to the connecting line with a smaller resistance value and the corresponding common line.

7. The thin film transistor array substrate according to claim 6, wherein a resistance value of the connecting line is gradually increased from the intermediate area of the fan-out area to two sides of the fan-out area; and
wherein the connecting line located in the intermediate area of the fan-out area connects to the data line located in an intermediate area of the sub display area, and the connecting line located at the two sides of the fan-out area connects to the data line located at the two sides of the sub display area;

wherein a capacitance value of the parasitic capacitors formed from the data line combination and the common line combination are reduced from the intermediate area of the sub display area to two sides of the sub display area.

8. The thin film transistor array substrate according to claim 6, wherein the common line comprises:

a first sub line being parallel to the data line; and at least one second sub line being parallel to the scanning line;

wherein the second sub line and the scanning line are formed from a first metal layer, the first sub line and the data line are formed from a second metal layer, the first sub line and the second sub line are connected by a through hole, and the through hole is disposed through an insulating layer between the scanning line and the data line;

the parasitic capacitor is formed from the data line and the second sub line of the common line.

9. The thin film transistor array substrate according to claim 6, wherein the connecting line combination comprises a first connecting line, a second connecting line and a third connecting line, the data line combination comprises a first data line, a second data line and a third data line, and the common line combination comprises a first common line, a second common line, and a third common line;

wherein the first connecting line is located the intermediate area of the fan-out area, and the second connecting line and the third connecting line are located at the two sides of the fan-out area respectively;

wherein the first data line and the first common line are located in the intermediate area of the sub display area, the second data line and the second common line are located at one side of the sub display area, and the third data line and the third common line are located at another side of the sub display area;

wherein the first data line connects to the first connecting line, the second data line connects to the second connecting line, and the third data line connects to the third connecting line; and wherein a first capacitance value of a first parasitic capacitor formed from the first common line and the first data line matches with a first resistance value of the first connecting line, a second capacitance value of a second parasitic capacitor formed from the second common line and the second data line matches with a second resistance value of the second connecting line, and a third capacitance value of a third parasitic capacitor formed from the third common line and the third data line matches with a third resistance value of the third connecting line.

10. The thin film transistor array substrate according to claim 9, wherein an overlapping area of the first common line and the first data line has a first area, an overlapping area of the second common line and the second data line has a second area, and an overlapping area of the third common line and the third data line has a third area;

wherein the overlapping area of the first common line and the first data line has a first interval between the first common line and the first data line, the overlapping area of the second common line and the second data line has a second interval between the second common line and the second data line, and the overlapping area of the third common line and the third data line has a third interval between the third common line and the third data line; and wherein a first ratio of the first area and the first distance is greater than a second ratio of the second area and the second distance, and the first ratio is greater than a third ratio of the third area and the third distance.

11. The thin film transistor array substrate according to claim 6, wherein a resistance value of the connecting line located in the intermediate area of the fan-out area is less than that of the connecting line located at the two skies of the fan-out area, a capacitance value of a parasitic capacitor located in the intermediate area of the sub display area is greater than that of a parasitic capacitor located at the two skies of the sub display area.

12. The thin film transistor array substrate according to claim 6, wherein a resistance value of the connecting line is gradually increased from the intermediate area of the fan-out area to two sides of the fan-out area; and wherein an overlapping area of the common line and the data line connected the connecting line is reduced from the intermediate area of the sub display area to two skies of the sub display area.

13. The thin film transistor array substrate according to claim 6, wherein a resistance value of the connecting line is gradually increased from the intermediate area of the fan-out area to two sides of the fan-out area; and wherein a thickness of the insulating layer between the common line and the data line connected the connecting line is gradually increased from the intermediate area of the sub display area to two skies of the sub display area.

14. The thin film transistor array substrate according to claim 6, wherein an overlapping area of the data line connected to the connecting line with a larger resistance value and the common line is less than that of the data line connected to the connecting line with a smaller resistance value and the common in the sub display area.

15. The thin film transistor array substrate according to claim 6, wherein a thickness of the insulating layer between the data line connected to the connecting line with a larger resistance value and the common line is greater than that of the data line connected to the connecting line with a smaller resistance value and the common in the sub display area.

16. The thin film transistor array substrate according to claim 6, wherein in the sub display area, a capacitance value of a parasitic capacitor connected to the connecting line with a larger resistance value is smaller, so as to ensure a current intensity of data signals transmitted in the data lines is within a predetermined range.

17. The thin film transistor array substrate according to claim 6, wherein the sub display area is strip-shaped, a longitudinal direction of the sub display area and the second direction are parallel to each other, at least two of the sub display areas are arranged by one dimensional array along the first direction, and the fan-out area is located in an end of the sub display area.

18. The thin film transistor array substrate according to claim 6, wherein the scanning line and the second sub line are disposed on the substrate;

wherein the thin film transistor array substrate further comprises an insulating layer disposed on the scanning line, the second sub line and the substrate; and wherein the data line and the first sub line are disposed on the insulating layer.

19. The thin film transistor array substrate according to claim 6, wherein a resistance value of the connecting line in the fan-out area is corresponding to a length of the connecting line, a length of the connecting line located in the intermediate of the fan-out area is less than that of the connecting line located at the two sides of the fan-out area.

20. A display panel, comprising a thin film transistor array substrate according to claim 6.

\* \* \* \* \*